(12) United States Patent
Hussell et al.

(10) Patent No.: US 8,167,674 B2
(45) Date of Patent: May 1, 2012

(54) PHOSPHOR DISTRIBUTION IN LED LAMPS USING CENTRIFUGAL FORCE

(75) Inventors: Christopher P. Hussell, Cary, NC (US); David T. Emerson, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 43 days.

(21) Appl. No.: 11/956,989

(22) Filed: Dec. 14, 2007

(65) Prior Publication Data

US 2009/0153022 A1 Jun. 18, 2009

(51) Int. Cl.
*H01J 9/24* (2006.01)
*H01L 51/56* (2006.01)

(52) U.S. Cl. .......................... 445/23; 313/503

(58) Field of Classification Search ............. None
See application file for complete search history.

(56) References Cited

U.S. PATENT DOCUMENTS

| | | | |
|---|---|---|---|
| 3,780,357 A | 12/1973 | Haitz | |
| 4,576,796 A * | 3/1986 | McCormick | 422/99 |
| 4,733,335 A | 3/1988 | Serizawa et al. | 362/503 |
| 4,918,497 A | 4/1990 | Edmond | 357/17 |
| 4,935,665 A | 6/1990 | Murata | 313/500 |
| 4,946,547 A | 8/1990 | Palmour et al. | 156/643 |
| 4,966,862 A | 10/1990 | Edmond | 437/100 |
| 5,027,168 A | 6/1991 | Edmond | 357/17 |
| 5,200,022 A | 4/1993 | Kong et al. | 156/612 |
| 5,210,051 A | 5/1993 | Carter, Jr. | 437/107 |
| 5,277,840 A | 1/1994 | Osaka et al. | 252/301 |
| 5,338,944 A | 8/1994 | Edmond et al. | 257/76 |
| RE34,861 E | 2/1995 | Davis et al. | 437/100 |
| 5,393,993 A | 2/1995 | Edmond et al. | 257/77 |
| 5,416,342 A | 5/1995 | Edmond et al. | 257/76 |
| 5,523,589 A | 6/1996 | Edmond et al. | 257/77 |
| 5,604,135 A | 2/1997 | Edmond et al. | 437/22 |
| 5,614,131 A | 3/1997 | Mukerji et al. | 264/1.9 |
| 5,631,190 A | 5/1997 | Negley | 438/33 |
| 5,739,554 A | 4/1998 | Edmond et al. | 257/103 |
| 5,766,987 A | 6/1998 | Mitchell et al. | 438/126 |
| 5,813,753 A | 9/1998 | Vriens et al. | 362/293 |
| 5,858,278 A | 1/1999 | Itoh et al. | 252/301 |
| 5,912,477 A | 6/1999 | Negley | 257/95 |
| 5,923,053 A | 7/1999 | Jakowetz et al. | 257/95 |
| 5,959,316 A | 9/1999 | Lowery | 257/98 |
| 5,998,925 A | 12/1999 | Shimizu et al. | 313/503 |

(Continued)

FOREIGN PATENT DOCUMENTS

DE 19945672 A1 4/2000

(Continued)

OTHER PUBLICATIONS

European Search Report of foreign counterpart application No. 08 17 1399; dated Apr. 28, 2009; pp. 2.

(Continued)

*Primary Examiner* — Toan Ton
*Assistant Examiner* — Britt D Hanley
(74) *Attorney, Agent, or Firm* — Koppel, Patrick, Heybl & Philpott

(57) ABSTRACT

A method of manufacturing an LED lamp is disclosed. The method includes admixing an uncured curable liquid resin and a phosphor, dispensing the uncured admixture on an LED chip, centrifuging the chip and the admixture to disperse the phosphor particles in the uncured resin, and curing the resin while the phosphor particles remain distributed.

23 Claims, 4 Drawing Sheets

U.S. PATENT DOCUMENTS

| | | | |
|---|---|---|---|
| 6,001,671 A | 12/1999 | Fjelstad | 438/112 |
| 6,066,861 A | 5/2000 | Hohn et al. | 257/99 |
| 6,069,440 A | 5/2000 | Shimizu et al. | 313/486 |
| 6,087,202 A | 7/2000 | Exposito et al. | 438/113 |
| 6,120,600 A | 9/2000 | Edmond et al. | 117/89 |
| 6,132,072 A | 10/2000 | Turnbull et al. | 362/494 |
| 6,139,304 A | 10/2000 | Centofante | 425/121 |
| 6,153,448 A | 11/2000 | Takahashi et al. | 438/114 |
| 6,187,606 B1 | 2/2001 | Edmond et al. | 438/46 |
| 6,201,262 B1 | 3/2001 | Edmond et al. | 257/77 |
| 6,252,254 B1 | 6/2001 | Soules et al. | 257/89 |
| 6,329,224 B1 | 12/2001 | Nguyen et al. | 438/127 |
| 6,331,063 B1 | 12/2001 | Kamada et al. | 362/237 |
| 6,338,813 B1 | 1/2002 | Hsu et al. | 264/272.14 |
| 6,366,018 B1 | 4/2002 | Garbuzov | |
| 6,376,277 B2 | 4/2002 | Corisis | 438/106 |
| 6,404,125 B1 | 6/2002 | Garbuzov et al. | 313/499 |
| 6,501,100 B1 | 12/2002 | Srivastava | |
| 6,522,065 B1 | 2/2003 | Srivastava | |
| 6,531,328 B1 | 3/2003 | Chen | 438/26 |
| 6,583,444 B2 | 6/2003 | Fjelstad | 257/82 |
| 6,624,058 B1 | 9/2003 | Kazama | 438/612 |
| 6,642,652 B2 | 11/2003 | Collins, III | 313/512 |
| 6,649,946 B2 | 11/2003 | Bogner et al. | |
| 6,653,765 B1 | 11/2003 | Levinson et al. | 313/112 |
| 6,669,866 B1 | 12/2003 | Kummer et al. | |
| 6,686,676 B2 | 2/2004 | McNulty | |
| 6,733,711 B2 | 5/2004 | Durocher et al. | 264/272.14 |
| 6,744,196 B1 | 6/2004 | Jeon | 313/498 |
| 6,759,266 B1 | 7/2004 | Hoffman | 438/64 |
| 6,791,119 B2 | 9/2004 | Slater, Jr. et al. | 257/99 |
| 6,791,259 B1 | 9/2004 | Stokes | |
| 6,793,371 B2 | 9/2004 | Lamke et al. | 362/241 |
| 6,812,500 B2 | 11/2004 | Reeh et al. | 257/98 |
| 6,853,010 B2 | 2/2005 | Slater, Jr. et al. | 257/98 |
| 6,860,621 B2 | 3/2005 | Bachl et al. | 362/373 |
| 6,919,683 B1 | 7/2005 | Jang | 313/503 |
| 6,921,929 B2 | 7/2005 | LeBoeuf et al. | 257/100 |
| 6,939,481 B2 | 9/2005 | Srivastava | |
| 6,958,497 B2 | 10/2005 | Emerson et al. | 257/94 |
| 7,023,019 B2 | 4/2006 | Maeda et al. | 257/89 |
| 7,029,935 B2 | 4/2006 | Negley et al. | |
| 7,049,159 B2 | 5/2006 | Lowery | 438/22 |
| 7,078,737 B2 | 7/2006 | Yuri | |
| 7,183,586 B2 | 2/2007 | Ichihara | |
| 7,183,587 B2 | 2/2007 | Negley et al. | 257/99 |
| 7,202,598 B2 | 4/2007 | Juestel et al. | 313/503 |
| 7,217,583 B2 | 5/2007 | Negley et al. | |
| 7,286,296 B2 | 10/2007 | Chaves et al. | 359/641 |
| 7,452,568 B2 * | 11/2008 | Hougham et al. | 427/240 |
| 7,601,550 B2 | 10/2009 | Bogner | |
| 7,714,342 B2 | 5/2010 | Lee et al. | 257/98 |
| 2001/0000622 A1 | 5/2001 | Reeh et al. | |
| 2002/0001869 A1 | 1/2002 | Fjelstad | |
| 2002/0006040 A1 | 1/2002 | Kamada et al. | |
| 2002/0056847 A1 | 5/2002 | Uemura et al. | |
| 2002/0057057 A1 | 5/2002 | Sorg | |
| 2002/0070449 A1 | 6/2002 | Yagi et al. | |
| 2002/0079837 A1 | 6/2002 | Okazaki | |
| 2002/0096789 A1 | 7/2002 | Bolken | |
| 2002/0105266 A1 | 8/2002 | Juestel et al. | |
| 2002/0123164 A1 | 9/2002 | Slater, Jr. et al. | |
| 2002/0185965 A1 | 12/2002 | Collins, III et al. | |
| 2003/0006418 A1 | 1/2003 | Emerson et al. | |
| 2003/0038596 A1 | 2/2003 | Ho | |
| 2003/0066311 A1 | 4/2003 | Li et al. | |
| 2003/0121511 A1 | 7/2003 | Hashimura et al. | |
| 2003/0207500 A1 | 11/2003 | Pichler et al. | |
| 2004/0004435 A1 | 1/2004 | Hsu | |
| 2004/0012027 A1 | 1/2004 | Keller et al. | |
| 2004/0012958 A1 | 1/2004 | Hashimoto et al. | |
| 2004/0037949 A1 | 2/2004 | Wright | |
| 2004/0038442 A1 | 2/2004 | Kinsman | |
| 2004/0041159 A1 | 3/2004 | Yuri et al. | |
| 2004/0041222 A1 | 3/2004 | Loh | |
| 2004/0056260 A1 | 3/2004 | Slater, Jr. et al. | |
| 2004/0106234 A1 | 6/2004 | Sorg et al. | |
| 2004/0164307 A1 | 8/2004 | Mueller-Mach et al. | |
| 2004/0173806 A1 | 9/2004 | Chua | |
| 2004/0188697 A1 | 9/2004 | Brunner et al. | |
| 2005/0002168 A1 | 1/2005 | Narhi et al. | |
| 2005/0006651 A1 | 1/2005 | LeBoeuf et al. | 257/79 |
| 2005/0051782 A1 | 3/2005 | Negley et al. | |
| 2005/0072981 A1 | 4/2005 | Suenaga | 257/88 |
| 2005/0122031 A1 | 6/2005 | Itai | |
| 2005/0184305 A1 | 8/2005 | Ueda | |
| 2005/0196886 A1 | 9/2005 | Jager et al. | |
| 2005/0211991 A1 | 9/2005 | Mori et al. | |
| 2005/0265404 A1 | 12/2005 | Ashdown | |
| 2005/0280894 A1 | 12/2005 | Hartkop et al. | 359/464 |
| 2006/0001046 A1 | 1/2006 | Batres et al. | |
| 2006/0068154 A1 * | 3/2006 | Parce et al. | 428/76 |
| 2006/0091788 A1 | 5/2006 | Yan | |
| 2006/0145170 A1 | 7/2006 | Cho | |
| 2006/0157721 A1 | 7/2006 | Tran et al. | |
| 2006/0189098 A1 | 8/2006 | Edmond | |
| 2006/0202105 A1 | 9/2006 | Krames et al. | |
| 2006/0267042 A1 | 11/2006 | Izuno | |
| 2006/0284195 A1 | 12/2006 | Nagai | |
| 2007/0012940 A1 | 1/2007 | Suh et al. | |
| 2007/0014318 A1 | 1/2007 | Hajjar et al. | |
| 2007/0024173 A1 * | 2/2007 | Braune | 313/485 |
| 2007/0034995 A1 | 2/2007 | Kameyama | |
| 2007/0096131 A1 | 5/2007 | Chandra | |
| 2007/0158668 A1 | 7/2007 | Tarsa et al. | |
| 2007/0158669 A1 | 7/2007 | Lee et al. | |
| 2007/0165403 A1 | 7/2007 | Park | 362/247 |
| 2007/0228404 A1 | 10/2007 | Tran et al. | |
| 2008/0006815 A1 | 1/2008 | Wang et al. | |
| 2008/0173884 A1 | 7/2008 | Chitnis et al. | 257/98 |
| 2008/0203410 A1 | 8/2008 | Brunner et al. | |
| 2008/0283865 A1 | 11/2008 | Yoo | |
| 2008/0303410 A1 * | 12/2008 | Kaneda et al. | 313/503 |

FOREIGN PATENT DOCUMENTS

| | | |
|---|---|---|
| DE | 102005062514 | 3/2007 |
| EP | 0732740 A2 | 9/1996 |
| EP | 1059678 | 12/2000 |
| EP | 1 138 747 A2 | 10/2001 |
| EP | 1138747 | 10/2001 |
| EP | 1198016 A2 | 11/2002 |
| EP | 1724848 | 11/2006 |
| EP | 1804304 | 7/2007 |
| FR | 2704690 | 11/1994 |
| JP | 02-086150 | 3/1990 |
| JP | 10-163525 | 6/1998 |
| JP | 2000002802 | 1/2000 |
| JP | 2000031530 | 1/2000 |
| JP | 2000-164937 A | 6/2000 |
| JP | 2000164937 * | 6/2000 |
| JP | 2000208820 A | 7/2000 |
| JP | 2000-349346 | 12/2000 |
| JP | 2002009097 A | 1/2002 |
| JP | 2002-050799 | 2/2002 |
| JP | 2002050799 | 2/2002 |
| JP | 2002-093830 | 3/2002 |
| JP | 2002-118293 | 4/2002 |
| JP | 2003-007929 | 1/2003 |
| JP | 2003-115614 | 4/2003 |
| JP | 2003-170465 | 6/2003 |
| JP | 2003-197655 | 7/2003 |
| JP | 2003-258011 | 9/2003 |
| JP | 2003318448 | 11/2003 |
| JP | 2004-031856 | 1/2004 |
| JP | 2004-266240 | 9/2004 |
| JP | 2004-363342 | 12/2004 |
| JP | 2005-252222 | 9/2005 |
| JP | 2005298817 | 10/2005 |
| JP | 2006054209 | 2/2006 |
| JP | 2006-245020 | 9/2006 |
| JP | 2006-253370 | 9/2006 |
| JP | 2008-129043 A | 6/2008 |
| JP | 2008-218511 A | 9/2008 |
| JP | 2000-299334 | 10/2010 |
| KR | 2004-0017926 | 3/2004 |
| WO | WO 0033390 | 6/2000 |
| WO | 0124283 | 4/2001 |

| | | |
|---|---|---|
| WO | WO 0124283 | 4/2001 |
| WO | WO 03/021668 | 3/2003 |
| WO | WO 2005101909 | 10/2005 |
| WO | WO 2006033695 A2 | 3/2006 |
| WO | WO 2006036251 A1 | 4/2006 |
| WO | WO 2006/065015 | 6/2006 |
| WO | WO 2008003176 A1 | 1/2008 |

OTHER PUBLICATIONS

First Examination Report from related European Patent Application No. 08171399.2, dated: Dec. 10, 2009.
Office Action for Korean Patent Application No. 10-2007-7008694 mailed Aug. 7, 2011.
Notification of Reasons for Rejection for Japanese Patent Application No. 2009-547219 dated Sep. 16, 2011.
Notification of Reasons for Rejection for Japanese Patent Application No. 2009-547218 dated Sep. 16, 2011.
Notice of Rejection of Japanese Patent Application No. 2006-526964 issued Sep. 13, 2011.
Notice of Reasons for Rejection for counterpart Japanese Patent Application No. JP 2008-317576 dated Sep. 13, 2011.
Nichia Corp. White LED Part No. NSPW300BS, Specification for Nichia White LED, Model NSPW300BS Jan. 14, 2004.
Nichia Corp. White LED Part No. NSPW312BS, Specification for Nichia White LED, Model NSPW312BS Jan. 14, 2004.
NPO-30394 Electrophoretic Deposition for Fabricating Microbatteries p. 1-2, NASA Tech Briefs Issue May 3, 2003.
Patent Abstracts of Japan 2004-221185, Aug. 5, 2004.
Patent Abstracts of Japan 11-040858, Feb. 12, 1999.
Patent Abstracts of Japan 2001-181613, Jul. 3, 2001.
JP 2005 033138 A, Feb. 2005 Iwao.
Patent Abstracts of Japan, 2003-258011, Sep. 12, 2003.
Patent Abstracts of Japan, 2002-093830, Mar. 29, 2002.
Office Action from U.S. Appl. No. 11/595,720, dated May 14, 2010.
Office Action from U.S. Appl. No. 11/827,626, dated Oct. 7, 2010.
Office Action from U.S. Appl. No. 12/008,477, dated Oct. 7, 2010.
Office Action from U.S. Appl. No. 11/881,683, dated May 12, 2010.
Office Action from U.S. Appl. No. 11/899,790, dated Jun. 2, 2010.
Office Action from U.S. Appl. No. 11/982,276, dated Aug. 19, 2010.
Office Action from U.S. Appl. No. 12/077,638, dated Jul. 7, 2010.
Office Action from U.S. Appl. No. 10/666,399, dated May 11, 2010.
Response to OA from U.S. Appl. No. 12/077,638, OA dated Dec. 8, 2009, filed Feb. 26, 2010.
Response to OA from U.S. Appl. No. 11/982,276, OA dated Dec. 7, 2009, filed Feb. 5, 2010.
Response to OA from U.S. Appl. No. 11/982,276, OA dated Aug. 19, 2010, filed Nov. 2, 2010.
Office Action from U.S. Appl. No. 11/982,276, dated Feb. 18, 2010.
Office Action from U.S. Appl. No. 11/398,214, dated Nov. 12, 2010.
Office Action from U.S. Appl. No. 11/656,759, dated May 21, 2010.
Office Action from U.S. Appl. No. 11/656,759, dated Mar. 9, 2011.
Office Action from U.S. Appl. No. 12/077,638, dated Dec. 21, 2010.
Response to OA from U.S. Appl. No. 11/595,720, dated May 14, 2010, filed Jul. 6, 2010.
Office Action from U.S. Appl. No. 12/077,638, dated Sep. 22, 2010.
Response to Office Action U.S. Appl. No. 11/398,214, OA dated Dec. 11, 2009, Resp. filed Mar. 2, 2010.
Response to Office Action U.S. Appl. No. 10/666,399, OA dated May 11, 2010, Resp. filed Aug. 11, 2010.
Response to Office Action U.S. Appl. No. 12/008,477, OA dated Mar. 1, 2010, Resp. filed May 26, 2010.
Response to Office Action U.S. Appl. No. 11/982,276, OA dated Mar. 25, 2010, Resp. filed Jun. 21, 2010.
Response to Office Action U.S. Appl. No. 11/881,683, OA dated May 12, 2010, Resp. filed Aug. 3, 2010.
Response to Office Action U.S. Appl. No. 12/077,638, OA dated Jul. 7, 2010, Resp. filed Aug. 30, 2010.
Response to Office Action U.S. Appl. No. 11/656,759, OA dated Nov. 25, 2009, Resp. filed Apr. 26, 2010.
Response to Office Action U.S. Appl. No. 11/899,790, OA dated Jun. 2, 2010, Resp. filed Nov. 1, 2010.
Response to Office Action U.S. Appl. No. 10/666,399, OA dated Dec. 22, 2009, Resp. filed Mar. 22, 2010.
Office Action from U.S. Appl. No. 11/881,683, dated Oct. 14, 2010.
Office Action from U.S. Appl. No. 11/899,790, dated Mar. 21, 2011.
Office Action from U.S. Appl. No. 11/982,276, dated Mar. 25, 2010.
Office Action from U.S. Appl. No. 11/827,626, dated Apr. 1, 2011.
Notice of Allowance from U.S. Appl. No. 10/666,399, dated Oct. 14, 2010.
Office Action from U.S. Appl. No. 11/398,214, dated Dec. 11, 2009.
Office Action from U.S. Appl. No. 12/506,989, dated Jul. 23, 2010.
Office Action from U.S. Appl. No. 10/666,399, dated Dec. 22, 2009.
Office Action from U.S. Appl. No. 12/506,989, dated Mar. 8, 2011.
Office Action from U.S. Appl. No. 12/008,477, dated Mar. 1, 2010.
Office Action from U.S. Appl. No. 11/656,759, dated Nov. 25, 2009.
Office Action from U.S. Appl. No. 11/881,683, dated Feb. 5, 2010.
Notice of Rejection (Final) in Japanese Patent Application No. 2006-526964 dated Feb. 22, 2011.
Minutes of Oral Proceedings (EPO Form 2009) in European Patent Application No. 05808825.3 dated Feb. 3, 2011.
Summons to Attend Oral Proceedings in European Patent Application No. 05808825.3 dated Feb. 3, 2011.
Office Action from Taiwan Patent Application No. 093128231 issued Apr. 21, 2011.
Second Office Action for Chinese Patent Application No. 200780050127.2 dated Jun. 15, 2011.
International Preliminary Examination Report for PCT Application No. PCT/US07/24366 mailed Jun. 29, 2011.
International Preliminary Examination Report for PCT Application No. PCT/US07/24367 mailed Jun. 29, 2011.
Decision to Refuse a European Patent Application regarding EP 05 808 825.3 dated Jun. 14, 2011.

* cited by examiner

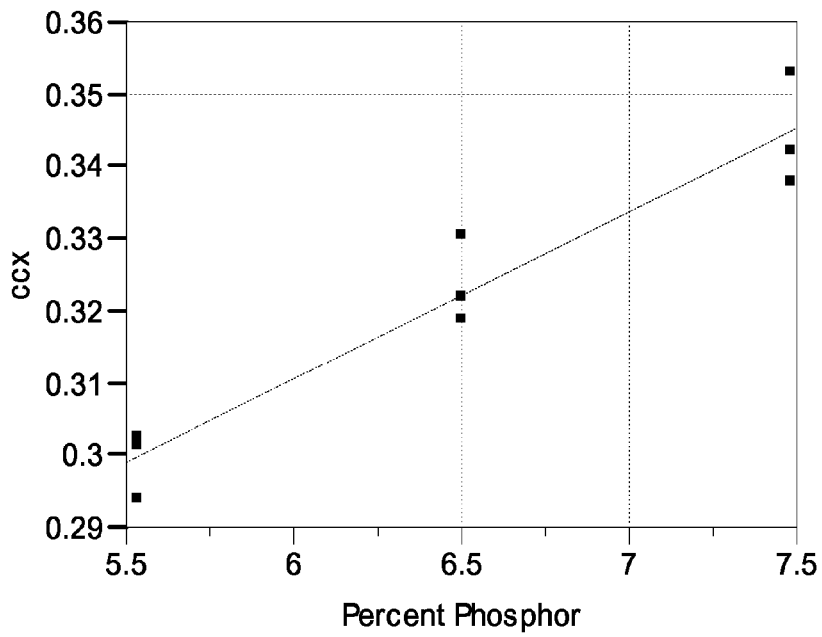
Fig. 6
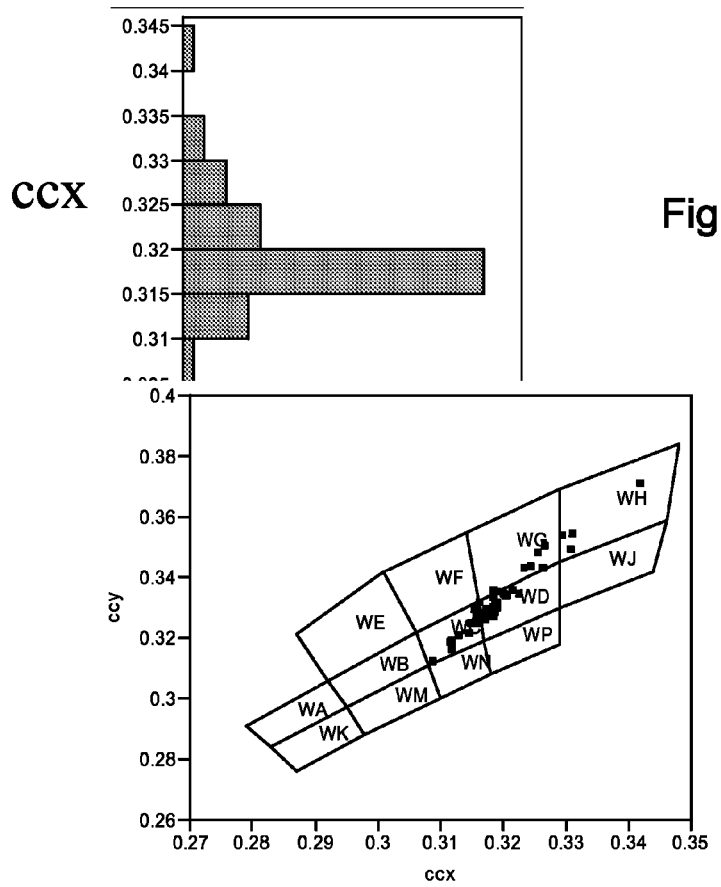
Fig. 7
Fig. 8

PHOSPHOR DISTRIBUTION IN LED LAMPS USING CENTRIFUGAL FORCE

BACKGROUND

The present invention relates to light emitting diodes and diode lamps in which a phosphor is used to absorb and modify the primary emission from the diode. In particular, the invention relates to light emitting diodes that emit in the blue, violet, and ultraviolet (UV) portions of the electromagnetic spectrum used in conjunction with an encapsulant package that contains a phosphor that down-converts the frequencies emitted by the diode into light with a strong yellow component to produce a combined output of white light.

Light emitting diodes (LEDs) are a class of photonic semiconductor devices that convert an applied electric current into light by encouraging electron-hole recombination events in an appropriate semiconductor material. In turn, some or all of the energy released in the recombination event produces a photon.

Light emitting diodes share a number of the favorable characteristics of other semiconductor devices. These include generally robust physical characteristics, long lifetime, high reliability, and, depending upon the particular materials, low cost.

A number of terms are used herein that are common and well-understood in the industry. In such industry use, however, these terms are sometimes informally blended in their meaning. Accordingly, these terms will be used as precisely as possible herein, but in every case their meaning will be clear in context.

Accordingly, the term "diode" or "chip" typically refers to the structure that minimally includes two semiconductor portions of opposite conductivity types (p and n) along with some form of ohmic contacts through which electric current is applied to the resulting p-n junction.

The term "lamp" is used to designate a light emitting diode that is matched with an appropriate electrical contact and potentially a lens to form a discrete device that can be added to or included in electrical circuits or lighting fixtures or both.

As used herein, the term "package" typically refers to the placement of the semiconductor chip on an appropriate physical and electrical structure (sometimes as simple as a small piece of metal through which the electrical current is applied) along with a lens that provides some physical protection to the diode and can optically direct the light output. Lenses are often formed of transparent polymers and in some cases the same polymer forms an encapsulant for the diode. In the present context, the package includes a reflective structure, frequently formed of a metal or polymer within which the diode rests. Adding a lens and electrical contacts typically forms a lamp.

Appropriate references about the structure and operation of light emitting diodes and diode lamps include Sze, PHYSICS OF SEMICONDUCTOR DEVICES, 2d Edition (1981) and Schubert, LIGHT-EMITTING DIODES, Cambridge University Press (2003).

The color emitted by an LED is largely defined by the material from which it is formed. Diodes formed of gallium arsenide (GaAs) and gallium phosphide (GaP) tend to emit photons in the lower energy (red and yellow) portions of the visible spectrum. Materials such as silicon carbide (SiC) and the Group III nitrides (e.g., AlGaN, InGaN, AlInGaN) have larger bandgaps and thus can generate photons with greater energy that appear in the green, blue and violet portions of the visible spectrum as well as in the ultraviolet portions of the electromagnetic spectrum. In particular the Group III nitrides have a direct bandgap and thus generate light more efficiently than indirect bandgap semiconductors such as SiC.

In the present application, the term "white light" is used in a general sense. Those familiar with the generation of colors and of color perception by the human eye will recognize that particular blends of frequencies can be defined as "white" for precise purposes. Although some of the diodes described herein can produce such precise output, the term "white" is used somewhat more broadly herein and includes light that different individuals or detectors would perceive as having a slight tint toward, for example, yellow or blue.

As the availability of blue-emitting LEDs has greatly increased, the use of yellow-emitting phosphors that down-convert the blue photons has likewise increased. Specifically, the combination of the blue light emitted by the diode and the yellow light emitted by the phosphor can create white light. In turn, the availability of white light from solid-state sources provides the capability to incorporate them in a number of applications, particularly including illumination and as lighting (frequently backlighting) for color displays. In such devices (e.g., flat computer screens, personal digital assistants, and cell phones), the blue LED and yellow phosphor produce white light which is then distributed in some fashion to illuminate the color pixels. Such color pixels are often formed by a combination of liquid crystal elements, color filters and polarizers, and the entire unit including the backlighting is generally referred to as a liquid crystal display. ("LCD").

Typical phosphors include minerals such as cerium-doped YAG (yttrium-aluminum-garnet). Because such phosphors are typically manufactured in the form of small particles, they must be physically dispersed as small particles on or near the diode chip. Similarly, because the encapsulant is typically a polymer resin, it typically takes the initial form of a liquid that at some point must be cast or molded into the desired shape (e.g., for a lens) and then cured into a solid form.

Accordingly, several basic combinations exist for positioning the phosphor with respect to the chip. First, the phosphor can be spread onto the chip after which the encapsulant can be added as a liquid and then allowed to cure. Although this is conceptually attractive, adding the mineral phosphor to precisely cover the chip before ever adding the encapsulant is a difficult process. As a result, its relative complexity can lower the overall rate of production while increasing the overall cost.

Theoretically, the chip could be encapsulated and then a resin coating added to the exterior of the resin, but in many cases this would produce an undesired optical result and would also prevent the encapsulant from protecting the phosphor.

Many conventional techniques for incorporating the phosphor mix the phosphor with the resin and then apply the resin-phosphor mixture to the chip. The resin is then allowed to cure with the phosphor dispersed within it.

This technique presents several challenges. First, the amount of phosphor controls the color point between the chip (e.g., blue-emitting) and the fully saturated color (e.g., yellow) of the phosphor. For the blue-chip, yellow-phosphor combination, the balance required to produce a consistent hue of white is achieved by controlling the phosphor used in the encapsulant and the amount of phosphor and encapsulant (resin) dispensed on, over, or around the chip.

As a more challenging issue, the position of the phosphor in the encapsulant with respect to the diode chip will usually affect the brightness or color uniformity of the lamp's external output. An undesired position of the phosphor can produce an undesired pattern of external output in which the output varies spatially among various shades of white.

In general, positioning the phosphor as close as possible to the chip produces the most desirable output.

Because of these and other factors, the resin-encapsulant-phosphor mixture must contain an appropriate amount of phosphor particles which are themselves of an appropriate size and in appropriate geometric relationship to the chip and to the cured encapsulant. Because the uncured resin is a liquid, however, its viscosity will affect the manner in which the phosphor will mix. If the viscosity of the resin is too low, the phosphor particles may settle within the encapsulant before it is dispensed into the package which causes undesired variation in the resulting color output. Alternatively, if the viscosity of the resin is too high, the phosphor particles will remain suspended within the encapsulant and fail to settle near the chip.

In order to deal with these difficulties, most conventional techniques attempt to maintain the viscosity of the uncured resin within a range that permits the phosphor to settle within the encapsulant under the influence of gravity. This in turn requires controlling the length of time ("working time") during which the resin will cure—the phosphor should reach the desired position(s) before the resin cures—as well as the temperature in an effort to maintain a favorable viscosity while the phosphor is settling. For example, at room temperature (25° C.), a typical 2-part silicon resin (e.g. SR-7010 from Dow Corning) will normally cure in about one minute at 150° C. and its viscosity will double (from respective starting points of about 20000 and 7000 millipascal for the parts) in about three (3) hours at room temperature.

As illustrative extremes, if the size of the resin particles is extremely fine and the viscosity of the resin is quite high, the phosphor will tend to remain suspended without settling or depositing in the desired manner. Alternatively, if the particles are too large and the resin viscosity too low, the phosphor will simply sink to the bottom of the resin before it can be dispensed into the lamp package. Based on these and other factors, the choice of resin, phosphor and other variables often represents a compromise.

Accordingly, the difficulties and complexities presented by phosphor-resin mixtures create and present corresponding difficulties in the efficiency and cost of diode packaging techniques.

SUMMARY

In one aspect the invention is a method of manufacturing an LED lamp comprising admixing an uncured curable liquid resin and a phosphor, dispensing the uncured admixture on an LED chip, centrifuging the chip and the admixture to settle or deposit the phosphor particles in the uncured resin, and curing the resin while the phosphor particles remain distributed at or near the desired positions.

In another aspect the invention is an apparatus for manufacturing light emitting diode lamps. The apparatus includes a centrifuge having at least one arm, a cup positioned adjacent the outer end of the arm, an LED chip in the cup, and an admixture in the cup of an uncured curable resident with a plurality of phosphor particles.

In yet another aspect, the invention is a method of manufacturing an LED lamp comprising admixing an uncured polysiloxane resin and a phosphor that emits predominantly in the yellow portion of the spectrum when excited by frequencies from the blue portion of the visible spectrum, placing the uncured admixture and an LED chip formed the Group III nitride material system and that emits in the blue portion of the visible spectrum into a reflector cup, centrifuging the reflector and the admixture to settle or deposit the phosphor particles in the uncured polysiloxane resin, and curing the resin while the phosphor particles remain distributed at or near the desired positions.

The foregoing and other objects and advantages of the invention and the manner in which the same are accomplished will become clearer based on the followed detailed description taken in conjunction with the accompanying drawings.

BRIEF DESCRIPTION OF THE DRAWINGS

FIG. 6 is a plot of the ccx color coordinate versus phosphor percentage in the encapsulant.

FIG. 7 is a bar graph of the output of 48 devices according to the invention.

FIG. 8 is a plot of the x and y coordinates from the CIE diagram for the same devices as FIG. 7.

DETAILED DESCRIPTION

Figure 1:
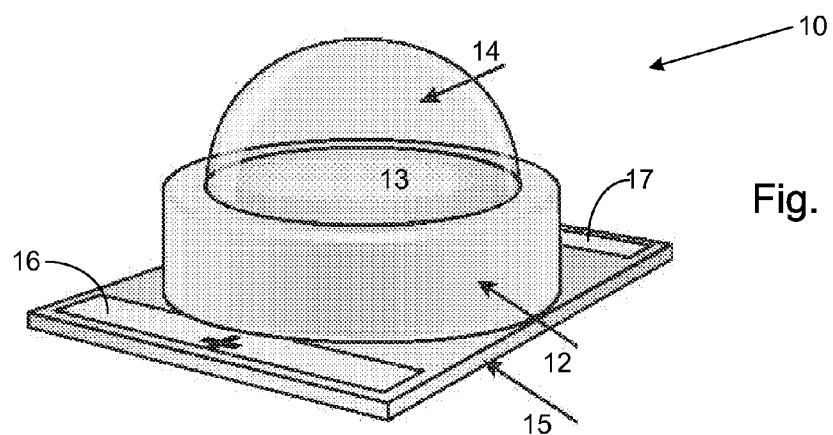
FIG. 1 is a perspective view of a light emitting diode lamp of the type manufactured using the method of the present invention.

The invention is a method of manufacturing a light emitting diode (LED) lamp. The method comprises admixing an uncured curable liquid resin and a phosphor, dispensing the uncured admixture on an LED chip, centrifuging (or otherwise exerting centrifugal force on) the chip and the admixture to position the phosphor particles in the uncured resin, and then curing the resin while the phosphor particles remain positioned on or near the desired surface of the diode.

As used herein, the phrase "uncured curable liquid resin" typically refers to a polymer resin that has not yet become cross-linked (e.g. thermosetting resins), or solidified based on temperature (thermoplastic resins). Thus, in some cases the uncured resin is a liquid at room temperature that will cross-link under the influence of heat, or time or (in some cases) ultraviolet light. In other cases, the uncured resin is a liquid at elevated temperatures and will solidify at temperatures approaching room temperature.

The resin (sometimes referred to as the "encapsulant") can be any material that is suitable for the purposes of the invention and that does not otherwise interfere with the operation of the LED chip or the other elements of the lamp. The term "resin" is used in a broad sense to refer to any polymer, copolymer or composite from which the package can be formed. These materials are generally well understood by those of ordinary skill in the art and need not be discussed in detail.

As set forth in co-pending and commonly assigned application Ser. No. 60/824,385 filed Sep. 1, 2006 for "Phosphor Position In Light Emitting Diodes," when the LED chip emits in the higher energy portions of the spectrum (e.g., blue, violet, and ultraviolet), the encapsulant should be less reactive or inert to the photons emitted at such frequencies. Thus, the polysiloxane ("silicone") resins tend to be particularly well suited for the encapsulant. In general, the term polysiloxane refers to any polymer constructed on a backbone of —(—Si—O—)$_n$— (typically with organic side groups). The polysiloxane resins offer greater stability with respect to higher frequency emissions as compared to the photostability of otherwise functionally similar materials such as polycarbonate or polyester resins (both of which may be acceptable in certain contexts). Polysiloxane resins also have high optical clarity, can be favorably elastomeric, and are less affected by thermal cycling than are some other polymers. They can be formulated with a range of refractive indices (1.40 to 1.58), a factor that can be used to reduce interfacial losses and enhance a lamp's external output. Viscosities of polysiloxane resins can range about 7000 to 20,000 millipascal-seconds, and the invention can be carried out with resins (or other liquids) having viscosities of less than 10 and up to 100,000 millipascal-seconds As noted earlier, the term LED chip refers to the basic semiconductor structure that emits the desired frequencies. As noted in the background, the structure and operation of light emitting diodes is well understood by persons of skill in this art and need not be discussed in detail herein. Exemplary structures are, however, typically formed from the Group III nitride material system and commercial examples are available from Cree, Inc., the assignee of the present invention, for example under the XLAMP® XR-E designation. Although the boundaries are somewhat arbitrary, blue light tends to fall in the 440-470 nanometer range and thus the blue-emitting XLAMP® XR-E chips will typically have a predominant wavelength of between about 450 and 465 nanometers. Other exemplary chips emit in other portions (e.g., red and green) of the spectrum and the invention can be applied to these as well.

The phosphor particles are selected to produce or enhance a given chip emission and to suit or enhance a particular application. In many cases, the phosphor is selected from among those materials that down-convert frequencies in the blue portion of the visible spectrum into frequencies in the yellow portion of the visible spectrum. Again, those persons skilled in this art will recognize that the phosphor need not emit exclusively in the yellow portion of the spectrum, but that a predominant emission in the yellow portion is helpful because the combination of blue light from the diode chips and yellow frequencies from the phosphor produces the desired white light. Again, the boundaries are somewhat arbitrary, but the yellow frequencies are generally in the 550-600 nanometer range with 570 nanometers being representative. In other embodiments, red-emitting, green-emitting and in some cases even blue-emitting phosphors can be added to produce a "warmer" white or to achieve a higher color rendering Index (CRI).

Depending upon the nature and amount of the phosphor, the combination of the chip and phosphor can produce "cool white" light with a color temperature of between about 5000 and 10,000 K, or "neutral white" (3700-5000 K) or "warm white" (2600-3700 K). The term "color temperature" is used in its well-understood sense to represent the temperature to which a theoretical "black body" would be heated to produce light of the same visual color.

One of the phosphors most useful for purposes of the invention is the yttrium aluminum garnet ("YAG"), typically doped with cerium. Other garnet structures that emit in the yellow region are known in the art (e.g., U.S. Pat. No. 6,669,866). White light can also be produced using LEDs that emit in the near-ultraviolet portion of the spectrum with combinations of red, blue and green emitting phosphors. For example, europium-doped strontium gallium sulfide ($SrGa_2S_4$:Eu) emits in the green portion of the spectrum while cerium-doped gadolinium aluminum oxide ($Gd_3Al_5O_{12}$:Ce) is excited at frequencies of about 470 nanometers and emits in the orange portion (about 525-620 nm) of the spectrum. Zinc sulfide doped with copper also emits in the green portion of the spectrum. Europium-doped nitridosilicates can emit in the yellow to red portion of the spectrum (e.g., U.S. Pat. No. 6,649,946).

It will thus be understood that although the invention is primarily described herein in terms of blue LEDs, yellow-emitting phosphors, and white LED lamps, the invention applies to any chip and phosphor combination that is enhanced by positioning the phosphor in the manner of the invention.

In preferred embodiments of the invention, the size of the phosphor particles can be selected by those of skill in this art without undue experimentation, but are typically in a size range of between about 0.001 microns and 20 microns per particle. If desired, the encapsulant can also include a scattering material, the nature and function of which is generally well understood in this art. A relevant explanation is set forth in commonly assigned US Patent Application Publication No. 20040012027 at Paragraphs 101 and 102.

The amount of the phosphor used in any given admixture can be selected by those of skill in this art as desired for a given diode and its desired output. Typically, the phosphor will be present in an amount of between about 1 and 50 percent by weight based on the weight of the resin, but higher or lower percentages can be used.

In order to take advantage the centrifuge method, the uncured mixture of resin and phosphor are typically placed into a cup. The term cup is used broadly herein to describe any container of an appropriate size for the chip, the resin, and the admixed phosphor. In many circumstances the cup will be the reflector portion of the resulting lamp as in the Figures herein. In the broadest sense, a cup is (or resembles) an open, bowl-shaped vessel, and cups for light emitting diodes can take such shapes. Reflectors of other shapes (e.g., rectangular cross-sections or other solid geometry), however, can still function as cups in the context of the present invention. Alternatively, a cup which does not serve as a reflector in the final lamp structure can be used temporarily during the centrifuging and curing steps, and then discarded, or can be part of a fixture used for phosphor deposition.

When the admixture of resin and phosphor are positioned in the cup along with the diode chip, they can be positioned in any appropriate centrifuge device provided it can be controlled in a manner that applies the desired amount of centrifugal force. In some cases, the empty cup can be placed in the centrifuge after which the chip can be added and after which the admixture can be added. In other circumstances, the chip can be placed in the cup and then the cup can be placed in the centrifuge and thereafter the admixture can be placed into the cup. In yet other circumstances, the chip and admixture can all be added to the cup before the cup is placed in the centrifuge. In each case, the speed of the centrifuge (typically expressed in revolutions per minute (rpm)) and the time of centrifuging can be used to control the phosphor placement based upon the size and density of the phosphor particles and the viscosity of the liquid resin.

Commercially available centrifuges are entirely appropriate for the process. For example, centrifuges that are useful for separating biological suspensions are quite suitable for purposes of the invention. Examples are well known to those of ordinary skill in the laboratory arts and include a number of those available from companies such as Beckman Coulter, with the ALLEGRA® X-12 benchtop centrifuge having been used successfully for this purpose (Beckman Coulter, Inc., 4300 N. Harbor Boulevard, P.O. Box 3100, Fullerton, Calif. 92834-3100, USA). This centrifuge has a maximum speed of 10,200 rpm with a fixed angle rotor and 3,750 rpm with a swinging bucket rotor of the type illustrated in FIG. 5.

As a formal detail, those familiar with the laws of motion will recognize that "centrifugal force" is sometimes referred to as a "pseudo-force" because it actually represents the combination of the momentum of an object moving in a circular path against the centripetal force holding the rotating object in position with respect to a center of rotation. Similarly, when used as a noun, the term "centrifuge" defines a machine using centrifugal force for separating substances of different densities, for removing moisture, or for simulating gravitational effects. When used as a verb, "centrifuge" defines the act of applying a centrifugal force in order to separate solids from liquids, or different layers in a liquid or to otherwise simulate and increase gravitational effects.

The invention is not limited to a single step of phosphor positioning and curing. In another embodiment, the phosphor can be deposited on multiple surfaces. In this embodiment, the phosphor is first deposited on a first surface using the centrifuging step, then after the resin has cured, the device can be turned, and an additional or different admixture of resin and phosphor can be dispensed, centrifuged, and cured.

In the same manner, the centrifuging step of the invention can be used with other conventional manufacturing steps as desired. Thus, one portion of the resin-phosphor admixture can be positioned on a chip without benefit of centrifuging and allowed to cure while the centrifuging and curing steps are carried out separately either before or after the conventional step.

In yet another embodiment, and one that is particularly useful for extremely small phosphor particle sizes, the phosphor can be admixed with a more volatile liquid and less viscous such as an organic solvent (e.g., isopropyl alcohol or water). The centrifuging step can then be used to position the phosphor particles adjacent the chip in the organic solvent, after which the solvent can be allowed to evaporate leaving the phosphor in position on the chip. An encapsulant or lens can then be added.

FIGS. 1-4 are illustrate diodes that can be made according to the invention. FIG. 1 illustrates an LED lamp broadly designated at 10 in perspective view that is similar to the Cree XLAMP® diodes referred to earlier. The diode 10 includes an LED chip 11 (FIGS. 2-4) which as noted earlier emits in the higher energy portions of the visible spectrum or in the near ultraviolet portions and is typically formed in the Group III nitride material system. The chip 11 sits in a cup 12 which in the illustrated embodiments also serves as a reflector for the lamp 10.

The phosphor, which in actuality may not be visible as individual particles to the naked eye, is schematically illustrated in FIG. 1 by the dotted portion 13 under the lens 14 of the lamp 10. It will be understood that the position of the phosphor 13 as illustrated in FIG. 1 a schematic given that the phosphor 13 will settle under the influence of centrifugal force to the surface furthest from the center of rotation. In the illustrated embodiments, the phosphor 13 becomes positioned on the chip surface or the package floor.

The reflector 12 is fixed on a mounting substrate 15 which also includes electrical contacts 16 and 17.

Figure 2:
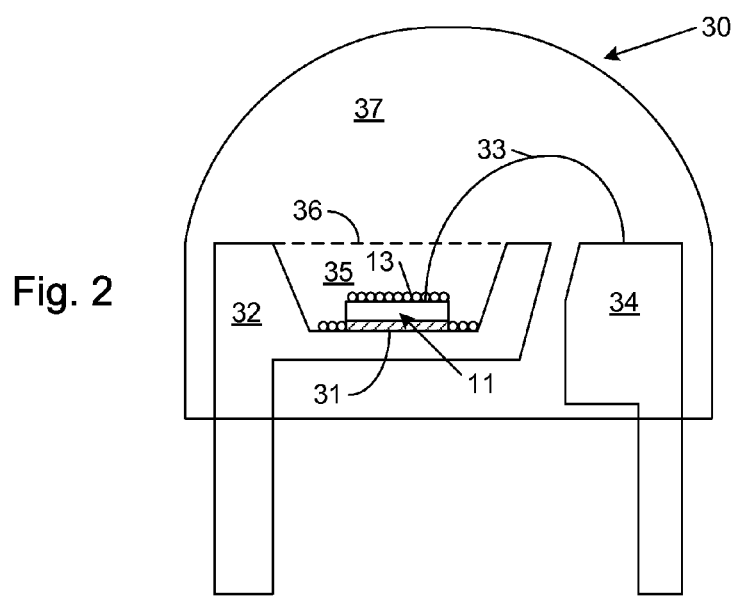
FIG. 2 is a cross sectional view of another light emitting diode lamp according to the present invention.

FIG. 2 illustrates the invention in the context of a bullet type my amp that is often sold in a five millimeter designation/baldly designated at 30. The lamp includes the chip and the phosphor particles are illustrated as the small circles 13. FIG. 2, although still schematic, more accurately represents one of the desired positions of the phosphor on the chip 11 and on the floor 31 of the reflector 32. The reflector 32 forms one of the electrodes for the overall lamp 30 and a wire 33 connects the diode chip 11 to the second electrode 34. The position of the encapsulant 35 in the cup formed by the reflector 32 is indicated by the dotted line 36. As mentioned in the background, the material for the lens 37 can be the same as the material for the encapsulant 35 or can be a different material depending upon the particular purpose or application of the lamp 30.

Figure 3:
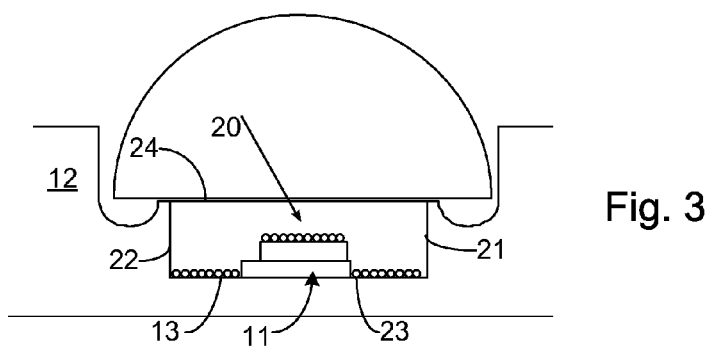
FIG. 3 is a schematic diagram of another lamp in accordance with the present invention.

FIG. 3 is another schematic cross-sectional view of the diode lamp 10 formed according to the invention. FIG. 3 illustrates portions of the cup (reflector) 12 in cross-section. The post-centrifuge position of the phosphor is indicated by the small circles 13. As FIG. 3 illustrates, the method includes adding sufficient resin and phosphor to fill an appropriate well 20 that is defined by the walls 21 and 22 and the floor 23 of the portion of the cup 12 that holds the chip 11.

An excess of resin, however, is undesirable because it would fill other portions of the reflector in an undesired and potentially wasteful manner. FIG. 3 illustrates the resin with a flat upper surface 24. This surface may cure downwardly forming a meniscus, but care must be taken to avoid overfilling because any excess may spill. Dispensing the phosphor resin mixture to partially fill, or totally fill, but in either case not exceed the volume of the well 20 prevents the resin-phosphor mixture from spilling under the applied centrifugal force. After the diode has been centrifuged, additional resin (or a different resin, or a preform) can be added to form the lens 14 illustrated in cross-section above the upper surface 24.

The shape of the lens can be selected or designed as desired or necessary based upon the end use the diode and may be influenced by other factors other factors such as the package or the method used to make the lens.

Figure 4:
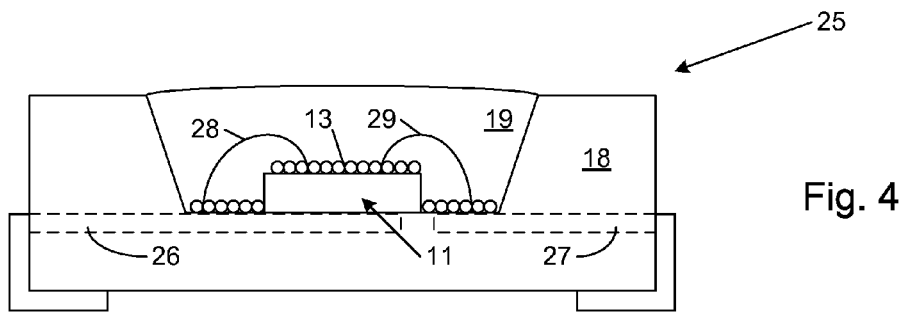
FIG. 4 is another cross-sectional schematic diagram of another lamp according to the present invention.

FIG. 4 is a schematic cross-sectional view of a side view diode (side mount, sidelooker, surface mount device ("SMD")) broadly designated at 25. The diode chip is again illustrated at 11 and the phosphor particles at 13. In this embodiment the reflector package 18 is often formed of a white polymer. If viewed from a top plan orientation, the package 18 can be round, rectangular or square in shape. Because an SMD such as the one illustrated at 25 is often positioned adjacent a light diffuser or in a similar orientation, the encapsulant 19 has a flat, nearly-flat, or concave profile and does not include the spherical lens illustrated in FIGS. 1-3. As FIG. 4 illustrates, the diode 11 can be positioned directly on one of the electrodes 26 or can be connected to the electrodes 26 and 27 using the wires 28 and 29.

Figure 5:
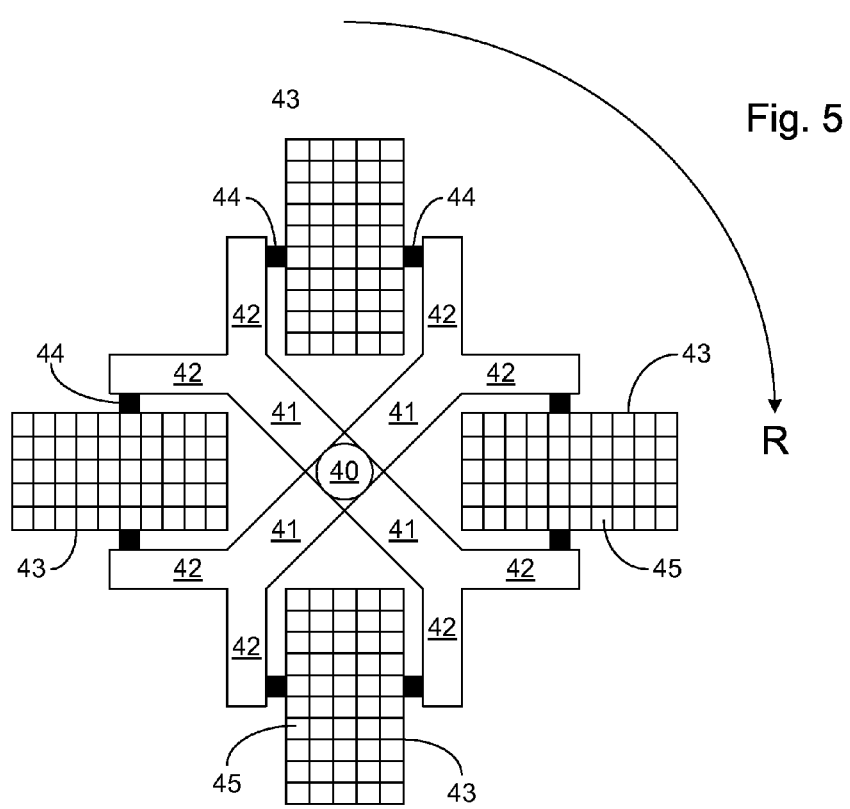
FIG. 5 is a top plan diagram of portions of a centrifuge useful in the method of the invention.

FIG. 5 is a top plan view of portions of a centrifuge of the type referred to previously. A rotor 40 defines a center of rotation and is typically driven by a motor (not shown). Four arms 41 extend from the rotor 40 and in the illustrated embodiment include the L-shaped extensions 42 that define respective positions at which four trays 43 can be attached using the pins schematically illustrated at 44. A direction of rotation is indicated by the arrow "R". When the centrifuge is at rest, diodes can be placed into the squares 45 in the trays 43 (or pre-loaded trays can be attached to the pins 44). In particular, the trays 43 can be designed with squares or other appropriate structures that match the size and shape of the diodes being centrifuged.

Because the trays 43 pivot on the arms 41, 42, the trays 43 can be loaded with diodes while the centrifuge is at rest with the trays 43 in a horizontal position. As the centrifuge rotates and the speed of rotation increases, the trays 43 can pivot on the pins 44 so that at higher speeds, the trays are oriented partially or fully vertically with respect to the arms 41 rather than in the horizontal position to which they return when the centrifuge slows or stops.

It will be understood that the design of the arms, the pins 44, and the trays 43 are based upon the particular diode being centrifuged and are entirely within the skill of those persons familiar with this art.

FIGS. 6-9 illustrate performance aspects of diodes according to the present invention. FIG. 6 illustrates a single phosphor mixed with the resin in three different weight percentages. Three diodes were fabricated and centrifuged according to the invention at each of the selected weight percentages of phosphor. A preferred ccx coordinate of 0.318 was selected as the goal and the appropriate percentage of phosphor required to produce such output calculated by linear regression. In this example, linear regression indicated that 6.33 percent by weight of phosphor would produce the desired color coordinate.

Those of skill in this art will recognize, however, that in addition to the weight percentage of phosphor, the particular color coordinate produced can vary based on the type of phosphor, the particular package, the specific output of the chip, the encapsulant, and other related factors.

Using the information gleaned from the experiment represented by FIG. 6, FIGS. 7 and 8 show the color coordinate output for 48 devices formed according to the invention in two separate lots, one at 6.36 percent by weight phosphor and the other at 6.35 percent. FIG. 7 illustrates that this produced a fairly consistent output among the diodes and the diodes represented by FIG. 8 had a median ccx coordinate of 0.3185.

Figure 9:
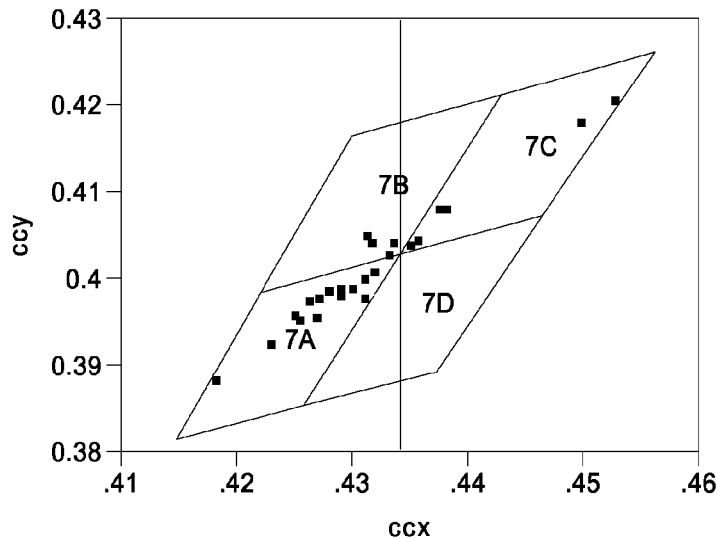
FIG. 9 is a plot of x and y coordinates from the CIE chromaticity diagram in which two phosphors were blended to obtain the output.

FIG. 9 represents a portion of the CIE diagram showing the results from a separate experiment in which the percentage of two blended phosphors (red and yellow) was adjusted to obtain a warmer white. The lettering in the various bins is arbitrary from the standpoint of the invention, but is used commercially to identify the different shades of white light produced by particular diodes or groups of diodes.

Figure 10:
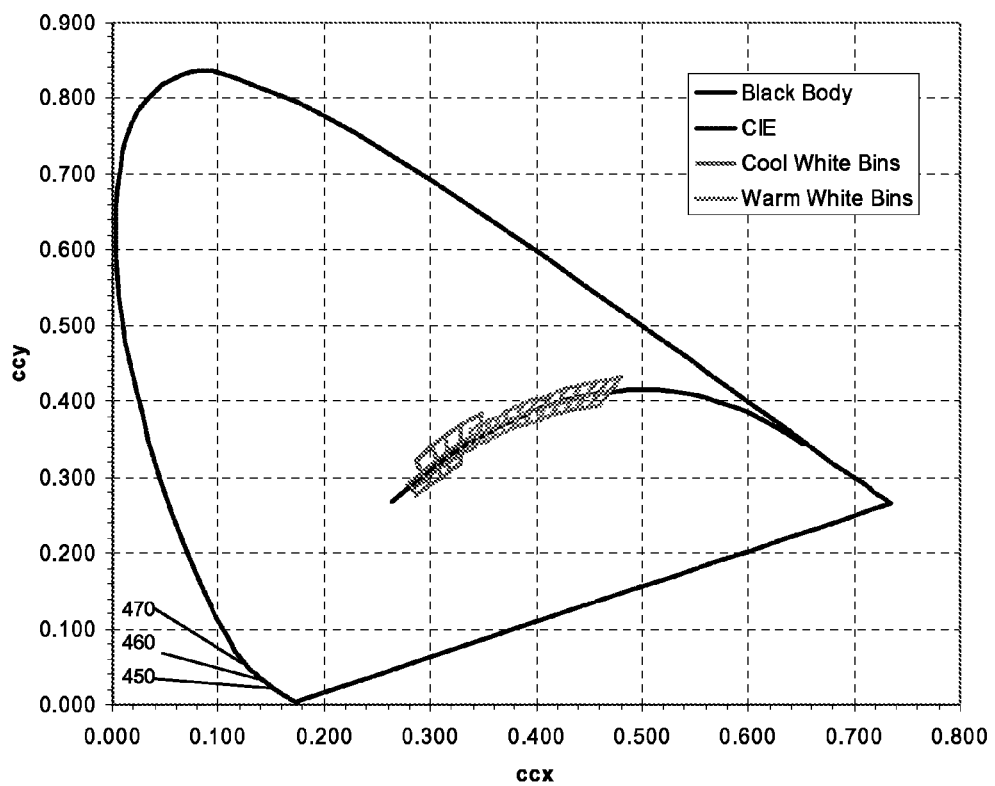
FIG. 10 is one reproduction of the CIE chromaticity diagram marked in wavelength (nanometers) and in the CIE x and y color coordinates.

FIG. 10 is included for comparison purposes, and represents one reproduction of the CIE chromaticity diagram marked in wavelength (nanometers) and in the CIE X and Y color coordinates, along with the color temperature line. The CIE diagram is widely available from a number of sources and well understood by those of skill in this art. Further background explanation is available in Schubert, supra, at Section 11.4 through 11.8. It is generally recognized that white light, or tones close to white light, are present near the (x, y)=(0.3, 0.3) coordinates.

In the drawings and specification there has been set forth a preferred embodiment of the invention, and although specific terms have been employed, they are used in a generic and descriptive sense only and not for purposes of limitation, the scope of the invention being defined in the claims.

The invention claimed is:

1. A method of manufacturing an LED lamp comprising:
    admixing an uncured curable liquid resin and a phosphor to create an admixture;
    dispensing the admixture on an LED chip; and
    centrifuging the chip and the admixture such that a centrifugal force normal to a surface on which the LED chip is mounted causes the phosphor particles to settle at a desired position with respect to the LED chip.

2. A method according to claim 1 further comprising curing the resin while the phosphor particles remain at the desired position.

3. A method according to claim 1 wherein the step of centrifuging the chip and the admixture comprises centrifuging the chip and the admixture in a centrifuge.

4. A method according to claim 1 comprising admixing the resin with a phosphor that down-converts frequencies in the blue portion of the visible spectrum into frequencies in the yellow portion of the visible spectrum.

5. A method according to claim 1 comprising admixing the resin with a phosphor selected from the group of phosphors that emit in the green and red portions of the visible spectrum.

6. A method according to claim 1 comprising admixing the resin with a blend of phosphors that emit in different portions of the visible spectrum.

7. A method according to claim 1 comprising admixing the resin with a yttrium aluminum garnet (YAG) phosphor.

8. A method according to claim 1 comprising placing an LED chip that emits in the blue portion of the visible spectrum into a cup with the admixed resin and phosphor.

9. A method according to claim 1 comprising admixing a polysiloxane resin with the phosphor.

10. A method according to claim 1 comprising adding a lens to the lamp after the centrifuging step.

11. A method according to claim 1 comprising:
    placing a cup in a centrifuge; and
    thereafter placing the chip in the cup; and
    thereafter placing the admixture in the cup with the chip; and
    thereafter centrifuging the cup and its contents to distribute the phosphor.

12. A method according to claim 1 comprising:
    placing the chip into a cup; and
    thereafter placing the cup into a centrifuge; and
    thereafter placing the admixture in the cup; and
    thereafter centrifuging the cup and its contents to distribute the phosphor.

13. An LED lamp produced by the method of claim 1.

14. An LED lamp according to claim 13 wherein said liquid resin is a polysiloxane resin.

15. An LED lamp according to claim 13 wherein the phosphor downconverts frequencies in the blue portion of the visible spectrum into frequencies in the yellow portion of the visible spectrum.

16. An LED lamp according to claim 15 wherein the phosphor comprises yttrium aluminum garnet.

17. An LED lamp according to claim 15 wherein the phosphor is selected from the group consisting of red-emitting, blue-emitting and green-emitting phosphors.

18. An LED lamp according to claim 13 wherein the LED chip has an active portion selected from the Group III nitride material system.

19. A method of manufacturing an LED lamp comprising:
    admixing an uncured polysiloxane resin and a phosphor that emits predominantly in the yellow portion of the spectrum when excited by frequencies from the blue portion of the visible spectrum to create an admixture;
    placing the uncured admixture and an LED chip formed from the Group III nitride material system and that emits in the blue portion of the visible spectrum into a reflector;

centrifuging the reflector and the admixture such that a centrifugal force causes the phosphor particles to settle at a desired position proximate to the LED chip in the uncured polysiloxane resin; and curing the resin while the phosphor particles remain settled proximate to the LED chip.

20. A method according to claim 19 comprising admixing the polysiloxane resin with a yttrium aluminum garnet phosphor.

21. A method according to claim 19 comprising admixing the polysiloxane resin and the phosphor with the phosphor present in an amount of between about 1 and 50 percent based on the weight of the resin.

22. A method according to claim 19 comprising admixing phosphor particles with an average particle size of between about 0.001 microns and 20 microns per particle.

23. A method according to claim 19 comprising admixing the phosphor particles with a polysiloxane resin having a starting viscosity of between about 10 and 100,000 millipascal-seconds.

* * * * *